United States Patent
Oishi et al.

(10) Patent No.: US 8,859,434 B2
(45) Date of Patent: Oct. 14, 2014

(54) ETCHING METHOD

(75) Inventors: Akimitsu Oishi, Hyogo (JP); Shoichi Murakami, Hyogo (JP)

(73) Assignee: SPP Technologies Co., Ltd., Tokyo (JP)

( * ) Notice: Subject to any disclaimer, the term of this patent is extended or adjusted under 35 U.S.C. 154(b) by 0 days.

(21) Appl. No.: 13/809,624

(22) PCT Filed: Jul. 11, 2011

(86) PCT No.: PCT/JP2011/065788
§ 371 (c)(1),
(2), (4) Date: Jan. 11, 2013

(87) PCT Pub. No.: WO2012/008409
PCT Pub. Date: Jan. 19, 2012

(65) Prior Publication Data
US 2013/0115772 A1    May 9, 2013

Related U.S. Application Data

(63) Continuation-in-part of application No. PCT/JP2011/056005, filed on Mar. 15, 2011.

(30) Foreign Application Priority Data

Jul. 12, 2010    (JP) ................... 2010-157648

(51) Int. Cl.
*H01L 21/302*    (2006.01)
*H01L 21/3065*   (2006.01)
*H01L 29/16*     (2006.01)

(52) U.S. Cl.
CPC ....... *H01L 21/30655* (2013.01); *H01L 29/1608* (2013.01)
USPC ............. 438/740; 216/37; 216/67; 438/689; 438/690; 438/692; 156/345.1

(58) Field of Classification Search
USPC ................. 216/37, 67; 438/692, 740
See application file for complete search history.

(56) References Cited

U.S. PATENT DOCUMENTS

| | | | |
|---|---|---|---|
| 6,967,176 B1 * | 11/2005 | Hoff | 438/778 |
| 7,780,793 B2 * | 8/2010 | Yang et al. | 134/1.2 |
| 2002/0018849 A1 * | 2/2002 | George et al. | 427/255.27 |

FOREIGN PATENT DOCUMENTS

| | | |
|---|---|---|
| JP | 2005-064392 | 3/2005 |
| JP | 2007-324503 | 12/2007 |
| JP | 2008-294210 | 12/2008 |
| JP | 2010-103358 | 5/2010 |

OTHER PUBLICATIONS

Flemish et al. Appl.Phys. Lett, 64, vol. 17, (1994), pp. 2315-2317.*
Plank et al. J.Phys.D (appl.Phys. vol. 36, (2003), pp. 482-487.*
J.R. Flemish, et al., Smooth etching of single crystal 6H-SiC in an electron cyclotron resonance plasma reactor, (C) 1994 American Institute of Physics, pp. 2315-2317, Appl. Phys. Lett., vol. 64, Nos. 17, Apr. 25, 1994.

* cited by examiner

*Primary Examiner* — Lan Vinh
*Assistant Examiner* — Maki Angadi
(74) *Attorney, Agent, or Firm* — Miller, Matthias & Hull LLP

(57) ABSTRACT

The present invention relates to an etching method of capable of etching a silicon carbide substrate with a higher accuracy. A first etching step in which a silicon carbide substrate K is heated to a temperature equal to or higher than 200 ° C, SF6 gas is supplied into a processing chamber and plasma is generated from the SF6 gas, and a bias potential is applied to a platen, thereby isotropically etching the silicon carbide substrate K, and a second etching step in which the silicon carbide substrate K is heated to a temperature equal to or higher than 200 ° C., SF6 gas and O2 gas are supplied into the processing chamber and plasma is generated from the SF6 gas and the O2 gas, and a bias potential is applied to the platen on which the silicon carbide substrate K is placed, thereby etching the silicon carbide substrate K while forming a silicon oxide film as passivation film on the silicon carbide substrate K are alternately repeated.

17 Claims, 7 Drawing Sheets

FIG. 4

| Supply flow rate of SF₆ gas (sccm) | Supply flow rate of O₂ gas (sccm) | Side-wall etching amount b (nm) | Sub-trench depth d (nm) |
|---|---|---|---|
| 4 0 | 0 | 9 4.5 | 0 |
| 4 0 | 1 0 | 6 6.2 | 0 |
| 4 0 | 4 0 | 3 7.6 | 1 9 |
| 4 0 | 6 0 | 0 | 8 0.8 |
| 4 0 | 1 0 0 | 0 | 2 8 |
| 4 0 | 2 0 0 | 0 | 3 7 |

| Corresponding figure | Step | Processing time (sec.) | Chamber inside pressure (Pa) | Power supplied to coil (W) | Power supplied to platen (W) | Supply flow rate of $SF_6$ (sccm) | Supply flow rate of Ar (sccm) | Supply flow rate of $O_2$ (sccm) | Supply flow rate of $SiCl_4$ (sccm) |
|---|---|---|---|---|---|---|---|---|---|
| Fig. 6 | Passivation-film formation | 10 | 3 | 2500 | 700 | 10 | 60 | 600 | — |
| | Etching | 2 | 3 | 2500 | 700 | 10 | 60 | — | — |
| Fig. 7 | Passivation-film formation | 30 | 3 | 1500 | 0 | — | — | 200 | 5 |
| | — | — | — | — | — | — | — | — | — |
| Fig. 8 | Passivation-film formation | 5 | 3 | 1500 | 0 | — | — | 200 | 5 |
| | Etching | 10 | 4 | 2500 | 700 | 10 | 60 | — | — |
| Fig. 9 | Passivation-film formation | 3 | 1.5 | 1000 | 700 | 5 | — | 600 | 5 |
| | Etching | 6 | 4 | 2500 | 700 | 10 | 60 | — | — |

ETCHING METHOD

CROSS-REFERENCE TO RELATED APPLICATIONS

This application is a U.S. National Stage filing under 35 USC §371 of International Patent Application No. PCT/JP2011/065788 filed on Jul. 11, 2011, which is a continuation-in-part of International Application No. PCT/JP2011/056005, filed on Mar. 15, 2011. This application also claims priority under the Paris Convention to Japanese Application No. 2010-157648, filed on Jul. 12, 2010.

FIELD OF THE DISCLOSURE

The present invention relates to an etching method in which plasma is generated from a processing gas to thereby etch a silicon carbide substrate.

BACKGROUND OF THE DISCLOSURE

In the semiconductor field, conventionally, a silicon substrate (Si substrate) has been used widely as substrate material. However, in recent years, attention has been paid to a silicon carbide substrate (SiC substrate) having physical properties superior to those of a silicon substrate. A silicon carbide substrate has a characteristic that it has a smaller crystal lattice constant and a larger band gap as compared with a silicon substrate, and a characteristic that it is difficult to etch because it has a small crystal lattice constant, that is, has a strong interatomic bond.

Therefore, as a method of etching a silicon carbide substrate, conventionally, the etching method disclosed in the Japanese Unexamined Patent Application Publication No. 2008-294210 has been suggested, for example. This etching method is configured to sequentially perform a mask forming step in which a silicon dioxide film ($SiO_2$ film) having a mask pattern of a predetermined shape is formed on the surface of the silicon carbide substrate, a first etching step in which the silicon carbide substrate is heated to a temperature between 70 and 100° C. and is plasma etched by a gas mixture of $SF_6$ gas, $O_2$ gas and Ar gas using the silicon dioxide film as mask, and a second etching step in which the silicon carbide substrate is heated to a temperature between 70 and 100° C. and is plasma etched by a gas mixture of Ar gas and $O_2$ gas using the silicon dioxide film as mask.

In the above etching method, the reason why etching is performed in two steps: the first etching step and the second etching step, is that, if only the first etching step is performed, as shown in FIG. 5(b), a trench (sub-trench) H' is additionally formed near the side wall in the bottom of a hole H or trench H formed by etching and it is therefore not possible to accurately etch the silicon carbide substrate. Therefore, the second etching step is performed to make the bottom of the hole H or trench H flat.

On the other hand, the applicant of the present application has suggested, as an etching method capable of etching a silicon carbide substrate in only one etching step, a method in which the silicon carbide substrate is heated to a temperature between 200 and 400° C. and is plasma etched using $SF_6$ gas or using a gas mixture including $SF_6$ gas and $O_2$ gas (the Japanese Unexamined Patent Application Publication No. 2009-246096).

In this etching method, the main two reasons why the silicon carbide substrate is heated to a temperature between 200 and 400° C. are as follows. That is, the first reason is that atoms constituting a silicon carbide substrate are difficult to react with radicals and ions generated by generation of plasma from $SF_6$ gas before the bonds between the atoms are broken, and the bonds between the atoms are more easily broken and the atoms more easily react with radicals and ions generated by generation of plasma from $SF_6$ gas as the temperature of the silicon carbide substrate increases. That is, a silicon substrate has an interatomic distance of silicon of approximately 0.25 nm and a bond energy of approximately 2 eV, while a silicon carbide substrate has an interatomic distance of silicon carbide of approximately 0.189 nm and a bond energy of approximately 4.5 eV, that is, a silicon carbide substrate has a smaller interatomic distance and a higher bond energy as compared with a silicon substrate, and therefore it is necessary to apply a large amount of energy for etching a silicon carbide substrate. Therefore, a silicon carbide substrate cannot be etched in the same way as a silicon substrate.

Further, the second reason is that when the temperature to which the silicon carbide substrate K is heated is low, as shown in FIG. 5(b), an additional sub-trench H' is easily formed near the side wall in the bottom of a hole H or trench H formed by etching, and when the temperature to which the silicon carbide substrate K is heated is high, as shown in FIG. 5(a), etching proceeds isotropically and the side wall of a hole H or trench H is easily etched (a bowing shape is easily formed).

Therefore, when the temperature to which the silicon carbide substrate K is heated is set between 200 and 400° C., the silicon carbide substrate K can be efficiently etched even though it has a strong interatomic bond. Further, at the time of etching, a sub-trench H' is never formed in the bottom of a hole H or trench H, or, even if a sub-trench H' is formed therein, it is a very small one. Furthermore, the side wall of a hole H or trench H is never etched, or, even if the side wall of a hole H or trench H is etched, it is very slight.

It is noted that the reason why formation of a sub-trench H' is not preferable is that a hole H or trench H formed by etching is for embedding an insulation film or an electrode therein, and, if a sub-trench H' is formed, concentration of electric field and stress easily occur at the sub-trench H' and device reliability is therefore reduced, which causes product defects. On the other hand, the reason why it is not preferable that the side wall of a hole H or trench H is etched is that a cavity easily occurs when embedding an insulation film or an electrode in the hole H or trench H and this results in a non-uniform film thickness of the side wall, which causes product defects, such as causing electric leakage

CITATION LIST

Patent document 1: Japanese Unexamined Patent Application Publication No. 2008-294210.

SUMMARY OF THE DISCLOSURE

However, even when the silicon carbide substrate K is heated to a temperature between 200 and 400° C. for etching, depending on the percentage of $O_2$ gas in the gas mixture including $SF_6$ gas and $O_2$ gas, it is possible that a sub-trench H' formed in the bottom of a hole H or trench H is large and that the side wall of a hole H or trench H is etched a lot.

FIG. 4 is a table showing the side-wall etching amount b and the depth d of sub-trench H' when a silicon carbide substrate K is etched for each of the cases where the flow rate of $O_2$ gas supplied into a processing chamber for etching is set at 0 (not supplied), 10, 40, 60, 100 and 200 sccm while the flow rate of $SF_6$ gas supplied into the processing chamber is set at a constant flow rate of 40 sccm. It is noted that other etching conditions are as follows: 50 sccm of Ar gas is supplied into the processing chamber in addition to the $SF_6$ gas and the $O_2$ gas; the temperature to which the silicon carbide substrate K is heated is a temperature between 200 and 400° C.; the RF power supplied to a coil for generating plasma is 2500 W; the RF power supplied to a platen on which the silicon carbide substrate K is placed is 700 W; and the pressure inside the processing chamber is 3 Pa. Further, the side-wall etching amount b and the depth d of sub-trench H' indicate the dimensions shown in FIG. 5, and they are converted into values per 1 μm depth of the hole H or trench H in FIG. 4. Therefore, values obtained by multiplying the side-wall etching amount b and the depth d of sub-trench H' in FIG. 4 by the actual depth of the hole H or trench H are the actual side-wall etching amount b and the actual depth d of sub-trench H'.

As seen from FIG. 4, when $O_2$ gas is not supplied (0 sccm) or the supply flow rate of $O_2$ gas is small (10 sccm), although a sub-trench H' is not formed, the side wall is etched and the etching shape is as shown in FIG. 5(a). On the other hand, when the supply flow rate of $O_2$ gas is large (60, 100, 200 sccm), although the side wall is not etched, a sub-trench H' is formed and the etching shape is as shown in FIG. 5(b). Further, the supply flow rate of $O_2$ gas is middle (40 sccm), the side wall is etched but the etching amount is smaller than that at the time of the small supply flow rate, a sub-trench H' is formed but it is smaller than that at the time of the large supply flow rate, and the etching shape is as shown in FIG. 5(c). It is noted that the reference M and the reference H in FIG. 5 indicate a mask and a hole or trench, respectively.

Here, it seems that the reason why the etching shape is as shown in FIG. 5(b) when the supply flow rate of $O_2$ gas is large is as follows. That is, silicon oxide (for example, $SiO_2$) is generated by reaction of silicon atoms generated by the etching of the silicon carbide substrate K and silicon atoms constituting a silicon compound (for example, $SiF_4$) with radicals and ions generated from the $O_2$ gas, and when the supply flow rate of $O_2$ gas is large, the silicon oxide, on one hand, forms a sufficient passivation film and thereby the side wall of a hole H or trench H is protected, and the silicon oxide, on the other hand, deposits (attaches) onto the bottom of the hole H or trench H. Because the etching proceeds by ion incidence, the etching rate in the vicinity of the side wall of a hole H or trench H where ion incidence is concentrated is high, and a sub-trench H' is therefore formed. Meanwhile, the reason why the etching shape is as shown in FIG. 5(a) when $O_2$ gas is not supplied or the supply flow rate of $O_2$ gas is small is that a passivation film is not sufficiently formed and therefore etching proceeds isotropically.

Thus, even when the silicon carbide substrate K is heated to a temperature between 200 and 400° C., depending on the percentage of $O_2$ gas in the gas mixture, it is possible that the sub-trench H' is large and that the side wall is etched a lot, and therefore there is a case where it is not possible to obtain an etching shape meeting a certain shape accuracy.

The present invention has been achieved in view of the above-described circumstances, and an object thereof is to provide an etching method capable of etching a silicon carbide substrate with a higher accuracy.

The present invention, for achieving the above-described object, relates to an etching method of etching a silicon carbide substrate placed on a platen in a processing chamber, characterized by alternately repeating a first step in which the silicon carbide substrate is heated to a temperature equal to or higher than 200 ° C., a processing gas including a fluorine-containing gas is supplied into the processing chamber and plasma is generated from the processing gas, and RF power is supplied to the platen to thereby apply a bias potential to the platen, thereby etching the silicon carbide substrate, and a second step which includes at least a processing for forming a silicon oxide film or a silicon nitride film as passivation film on the silicon carbide substrate.

According to this etching method, the first step in which the silicon carbide substrate is heated to a temperature equal to or higher than 200 ° C., plasma is generated from a processing gas including a fluorine-containing gas, and a bias potential is applied to the platen, and the second step which includes at least a processing for forming a silicon oxide film or a silicon nitride film as passivation film on the silicon carbide substrate are repeated.

In the first step, ions generated by the generation of plasma from the fluorine-containing gas are made incident onto the silicon carbide substrate by the bias potential and collide therewith and thereby the silicon carbide substrate is etched, and radicals and ions generated from the generation of plasma from the fluorine-containing gas react with silicon atoms constituting the silicon carbide substrate and thereby the silicon carbide substrate is etched.

In the second step, silicon atoms generated by the etching of the silicon carbide substrate and silicon atoms constituting a silicon compound react with radicals and ions of oxygen or nitrogen and thereby silicon oxide or silicon nitride (for example, SiNx) is generated, and a silicon oxide film or a silicon nitride film is formed on surfaces of a hole and a trench by the silicon oxide or silicon nitride. The passivation film on the bottoms of the hole and the trench, on which a large amount of ions are incident, is removed and the bottoms of the hole and the trench are etched, while the side walls of the hole and the trench, on which a small amount of ions are incident, are prevented by the passivation film from being etched.

When these first and second steps are repeated, because a silicon oxide film or a silicon nitride film is formed on the silicon carbide substrate in the second step, etching can be performed in the direction of the depth of the hole and the trench while suppressing etching of the side walls and while preventing formation of an additional trench near the side walls of the hole and the trench. Thereby, it is possible to prevent formation of a bowing shape and a sub-trench.

Further, the present invention, for achieving the above described object, relates to an etching method according to claim 1, characterized in that in the first step, the silicon carbide substrate is isotropically etched, and in the second step, the silicon carbide substrate is heated to a temperature equal to or higher than 200° C., a processing gas including a fluorine-containing gas and oxygen gas or nitride gas is supplied into the processing chamber and plasma is generated from the processing gas, and RF power is supplied to the platen to thereby apply a bias potential to the platen, thereby etching the silicon carbide substrate while forming a silicon oxide film or a silicon nitride film as passivation film on the silicon carbide substrate.

According to this etching method, the processing in which the silicon carbide substrate is isotropically etched of the first step and the processing in which the silicon carbide substrate is heated to a temperature equal to or higher than 200° C., plasma is generated from a processing gas including a fluorine-containing gas and oxygen gas or nitride gas, and a bias potential is applied to the platen, thereby etching the silicon carbide substrate while forming a silicon oxide film or a silicon nitride film as passivation film on the silicon carbide substrate of the second step are repeated.

In the first step, ions generated by the generation of plasma from the fluorine-containing gas are made incident onto the silicon carbide substrate by the bias potential and collide therewith and thereby the silicon carbide substrate is etched, and radicals and ions generated by the generation of plasma from the fluorine-containing gas react with silicon atoms constituting the silicon carbide substrate and thereby the silicon carbide substrate is etched. In this way, the silicon carbide substrate is isotropically etched.

Further, in the second step, ions generated by the generation of plasma from the fluorine-containing gas and the oxygen gas or nitride gas are made incident onto the silicon carbide substrate by the bias potential and collide therewith and thereby the silicon carbide substrate is etched, and radicals and ions generated by the generation of plasma from the fluorine-containing gas react with silicon atoms constituting the silicon carbide substrate and thereby the silicon carbide substrate is etched. Further, silicon atoms generated by the etching of the silicon carbide substrate and silicon atoms constituting a silicon compound react with radicals and ions generated by the generation of plasma from the oxygen gas or nitrogen gas and thereby silicon oxide or silicon nitride (for example, SiNx) is generated, and a passivation film is formed on surfaces of a hole and a trench by the silicon oxide or silicon nitride. The passivation film on the bottoms of the hole and the trench, on which a large amount of ions are incident, is removed and the bottoms of the hole and the trench are etched, while the side walls of the hole and the trench, on which a small amount of ions are incident, are prevented by the passivation film from being etched.

When these first and second steps are repeated, because etching proceeds also at the central portions of the bottoms of the hole and the trench and thereby formation of an additional trench near the side walls in the bottoms of the hole and the trench is prevented in the first step and etching of the side walls of the hole and the trench is prevented in the second step, etching can be performed in the direction of the depth of the hole and the trench while suppressing etching of the side walls and while preventing formation of an additional trench near the side walls of the hole and the trench. Thereby, it is possible to prevent formation of a bowing shape and a sub-trench.

Thus, according to the etching method of the present invention, alternate repetition of the first step in which the silicon carbide substrate is isotropically etched and the second step in which the silicon carbide substrate is etched while forming a passivation film to protect the side walls of a hole and a trench allows the etching to proceed in the direction of the depth of the hole and the trench while suppressing etching of the side walls of the hole and the trench and while preventing formation of an additional trench near the side walls of the hole and the trench. Therefore, it is possible to etch the silicon carbide substrate with a higher accuracy.

It is noted that the second step may be configured so that a processing gas including oxygen gas or nitrogen gas is supplied into the processing chamber and plasma is generated from the processing gas, and RF power equal to or more than 300 W is supplied to the platen to thereby apply a bias potential to the platen, thereby etching the silicon carbide substrate while forming a silicon oxide film or a silicon nitride film as passivation film on the silicon carbide substrate.

In this case, in the second step, ions generated by the generation of plasma from the oxygen gas or nitrogen gas are made incident on the silicon carbide substrate by the bias potential and collide therewith and thereby the silicon carbide substrate is etched, and silicon atoms generated by the etching of the silicon carbide substrate react with radicals and ions generated by the generation of plasma from the oxygen gas or nitrogen gas and thereby silicon oxide or silicon nitride is generated, and a passivation film is formed on surfaces of a hole and a trench by the silicon oxide or silicon nitride. It is noted that the reason why RF power equal to or more than 300 W is supplied to the platen is that, if RF power equal to or more than 300 W is not supplied and therefore a bias potential corresponding thereto is not applied to the platen, the amount of the ions incident on the silicon carbide substrate is small and it is therefore not possible to generate silicon atoms enough for forming a passivation film having a level higher than a certain level.

Further, the second step may be configured so that a processing gas including a silicon-containing gas and oxygen gas or nitrogen gas is supplied into the processing chamber and plasma is generated from the processing gas, and a silicon oxide film or a silicon nitride film is formed as passivation film on the silicon carbide substrate.

In this case, in the first step, ions generated by the generation of plasma from the fluorine-containing gas are made incident onto the silicon carbide substrate by the bias potential and collide therewith and thereby the silicon carbide substrate is etched, and radicals and ions generated by the generation of plasma from the fluorine-containing gas react with silicon atoms constituting the silicon carbide substrate and thereby the silicon carbide substrate is etched.

On the other hand, in the second step, radicals and ions generated by the generation of plasma from the silicon-containing gas react with radicals and ions generated by the generation of plasma from the oxygen gas or nitrogen gas and thereby silicon oxide or silicon nitride is generated, and a passivation film is formed on surfaces of a hole and a trench by the silicon oxide or silicon nitride.

When these first and second steps are repeated, because the passivation film is removed and etching is performed in the first step and the passivation film is formed on the side walls and the bottoms of the hole and the trench in the second step, etching proceeds in the direction of the depth of the hole and the trench while the side walls of the hole and the trench are prevented from being etched. Therefore, similarly to the above, it is possible to prevent formation of a bowing shape and a sub-trench.

Further, in the first step when the first and second steps are repeated, a processing gas including a fluorine-containing gas and oxygen gas may be supplied into the processing chamber to generate plasma therefrom. In this way, it is possible to cause carbon atoms generated by the etching of the silicon carbide substrate to react with radicals and ions generated by the generation of plasma from the oxygen gas to thereby convert the carbon atoms into an oxide and then remove the oxide. Therefore, it is possible to prevent occurrence of a residue which is caused by deposition of a compound including carbon on the hole and the trench.

Further, in a case where a processing gas including a fluorine-containing gas and oxygen gas is used in both the first and second steps, it is preferable that a processing gas including a fluorine-containing gas and oxygen gas is supplied into the processing chamber and plasma is generated from the processing gas and the supply flow rate of the oxygen gas is equal to or less than 1.25 times that of the fluorine-containing gas in the first step, and a processing gas including a fluorine-containing gas and oxygen gas is supplied into the processing chamber and plasma is generated from the processing gas and the supply flow rate of the oxygen gas is equal to or more than 0.75 times that of the fluorine-containing gas in the second step.

As described above, when the supply flow rate of oxygen gas is large, although the side walls are prevented by the passivation film from being etched, an additional trench is easily formed near the side walls in the bottoms of the hole and the trench. On the other hand, when the supply flow rate of oxygen gas is small, the passivation film is hardly formed and therefore etching easily proceeds isotropically (see FIGS. 4 and 5).

Therefore, when the supply flow rate of oxygen gas in each etching step is set as described above, in the first step, the central portions of the bottoms of the hole and the trench in which a sub-trench has been formed are etched and the bottoms are made flat or into a round shape (a shape in which the bottom has a deeper depth at the central portion than near the side wall), thereby allowing etching to proceed in the direction of the depth of the hole and the trench while preventing formation of a bowing shape and a sub-trench, and in the second step, it is possible to prevent the side walls of the hole and the trench from being etched. It is more preferable that the supply flow rate of oxygen gas is equal to or less than one time the supply flow rate of fluorine-containing gas in the first step and the supply flow rate of oxygen gas is equal to or more than one time the supply flow rate of fluorine-containing gas in the second step, and it is much more preferable that the supply flow rate of oxygen gas is equal to or less than 0.25 times the supply flow rate of fluorine-containing gas in the first step and the supply flow rate of oxygen gas is equal to or more than 1.5 times the supply flow rate of fluorine-containing gas in the second step. Further, it is preferable that the supply flow rate of oxygen gas in the second step is larger than that in the first step, and a supply flow rate of oxygen gas between 0.75 and 1.25 times the supply flow rate of fluorine-containing gas is a supply flow rate which results in an etching shape in which the side wall is etched slightly and a small sub-trench H' is formed as shown in FIG. 5(c), and it is therefore applicable to both the first and second steps.

It is noted that, as the fluorine-containing gas, there can be mentioned, for example, $SF_6$ gas, and as the silicon-containing gas, there can be mentioned, for example, $SiF_4$ gas. Additionally, when heating the silicon carbide substrate, the silicon carbide substrate may be heated by incidence of ions generated by the generation of plasma from a processing gas, by a heater, or by both of ion incidence and a heater. In a case where the temperature of the silicon carbide substrate becomes too high, cooling of the silicon carbide substrate may be combined.

As described above, according to the etching method of the present invention, it is possible to prevent formation of a bowing shape and a sub-trench and obtain a more highly accurate etching shape.

BRIEF DESCRIPTION OF THE DRAWINGS

FIG. 4 shows the relationship between supply flow rates of $SF_6$ gas and $O_2$ gas and side-wall etching amount and sub-trench depth;

FIG. 10 is a table showing processing conditions of the examples shown in FIGS. 6 to 9.

DETAILED DESCRIPTION

Hereinafter, a specific embodiment of the present invention will be described on the basis of the accompanying drawings. It is noted that, in this embodiment, a silicon carbide substrate having the crystal structure of 4H-SiC is etched and an etching mask made of, for example, a silicon dioxide film is formed on the surface of the silicon carbide substrate.

Figure 1:
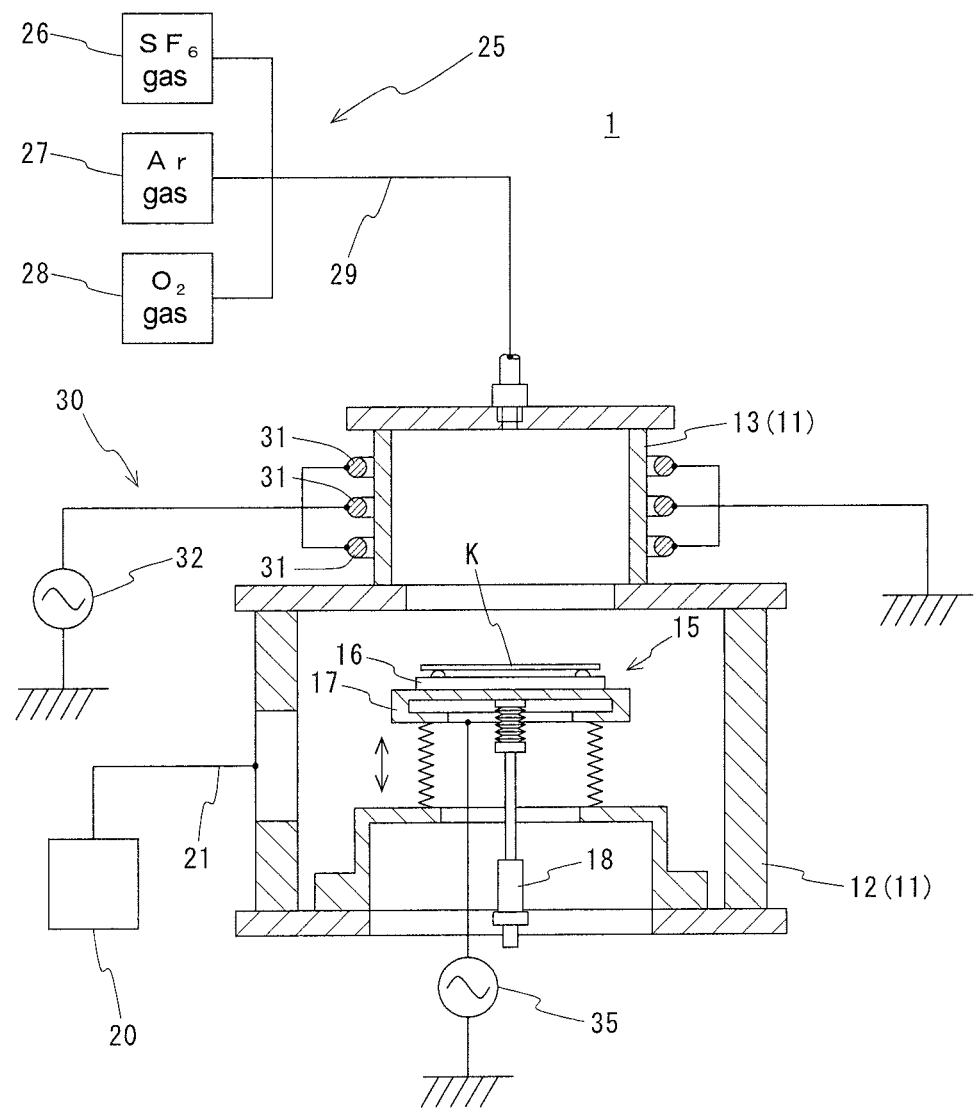
FIG. 1 is a sectional view showing a schematic configuration of an etching apparatus for performing an etching method according to one embodiment of the present invention.

Initially, on the basis of FIG. 1, an etching apparatus 1 for performing an etching method according to one embodiment of the present invention will be described. As shown in FIG. 1, the etching apparatus 1 has a processing chamber 11 having a closed space, a platen 15 which is disposed in the processing chamber 11 to be movable up and down and on which a silicon carbide substrate K is placed, a lifting cylinder 18 lifting up and down the platen 15, an exhaust device 20 reducing the pressure inside the processing chamber 11, a gas supply device 25 supplying a processing gas into the processing chamber 11, a plasma generating device 30 generating plasma from the processing gas supplied into the processing chamber 11, and an RF power supply unit 35 for supplying RF power to the platen 15.

The processing chamber 11 comprises a lower chamber 12 and an upper chamber 13 which each have an inner space communicating with that of the other, and the upper chamber 13 is formed to be smaller than the lower chamber 12. The platen 15 comprises an upper member 16 on which the silicon carbide substrate K is placed and a lower member 17 to which the lifting cylinder 18 is connected, and is disposed in the lower chamber 12.

The exhaust device 20 has an exhaust pipe 21 connected to a side surface of the lower chamber 12 and exhausts the gas within the processing chamber 11 through the exhaust pipe 21 to reduce the pressure inside the processing chamber 11 to a predetermined pressure.

The gas supply device 25 has a gas supply section 26 for supplying $SF_6$ gas as a fluorine-containing gas, a gas supply section 27 for supplying Ar gas as a carrier gas, a gas supply section 28 for supplying $O_2$ gas as a carrier gas, and a supply pipe 29 one end of which is connected to the top surface of the upper chamber 13 and the other end of which is branched and is connected to the gas supply sections 26, 27, 28, and supplies $SF_6$ gas, Ar gas and $O_2$ gas as the processing gas into the processing chamber 11 from the gas supply sections 26, 27, 28 through the supply pipe 29.

The plasma generating device 30 comprises a plurality of annular coils 31 aligned vertically on the outer periphery of the upper chamber 13 and an RF power supply unit 32 for supplying RF power to the coils 31, and generates plasma from the processing gas supplied into the upper chamber 13 by causing the RF power supply unit 32 to supply RF power to the coils 31.

The RF power supply unit 35 supplies RF power to the platen 15 to produce a potential difference (bias potential) between the platen 15 and the plasma, thereby making ions generated by the generation of plasma from the processing gas incident onto the silicon carbide substrate K.

Subsequently, a method of etching the silicon carbide substrate K using the etching device 1 configured as described above is described.

Figure 2:
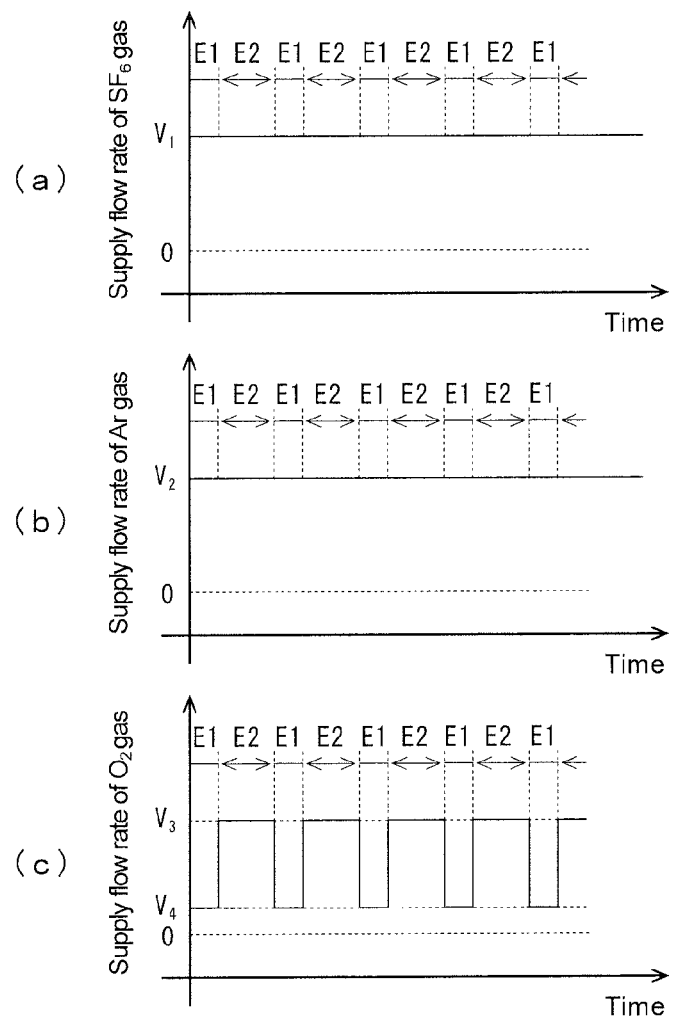
FIG. 2 is a timing chart showing the state of control of supply flow rates of $SF_6$ gas, Ar gas and $O_2$ gas in the embodiment.

First, a silicon carbide substrate K is loaded into the processing chamber 11 and is placed onto the platen 15. Thereafter, a first etching step (first step) E1 in which isotropic etching is performed by controlling supply flow rates of $SF_6$ gas, Ar gas and $O_2$ gas supplied into the processing chamber 11 as shown in FIG. 2, and a second etching step (second step) E2 in which etching is performed while forming a passivation film are alternately repeated. It is noted that, as shown in FIG. 2, the supply flow rates of $SF_6$ gas and Ar gas are constant regardless of the steps E1, E2, and the supply flow rate of $O_2$ gas is changed depending on the steps E1, E2.

In the first etching step E1, the silicon carbide substrate K is heated to a temperature equal to or higher than 200° C., $SF_6$ gas, Ar gas and $O_2$ gas are supplied into the processing chamber 11 from the gas supply sections 26, 27, 28, respectively, the pressure inside the processing chamber 11 is reduced to a predetermined pressure by the exhaust device 20, and RF power is supplied to the coils 31 and the platen 15 by the RF power supply units 32, 35, respectively.

Figure 5:
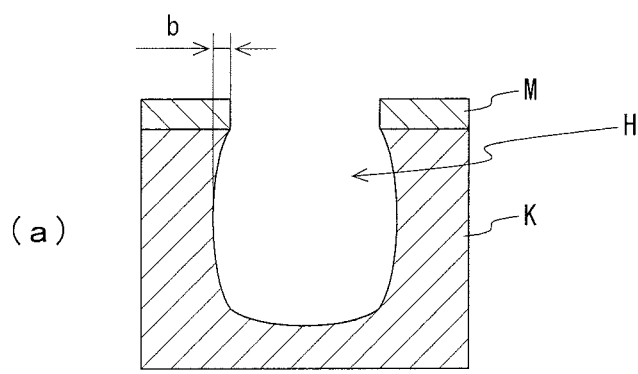
FIG. 5 shows sectional views showing the relationship between supply flow rates of $SF_6$ gas and $O_2$ gas and etching shape.
Figure 5:
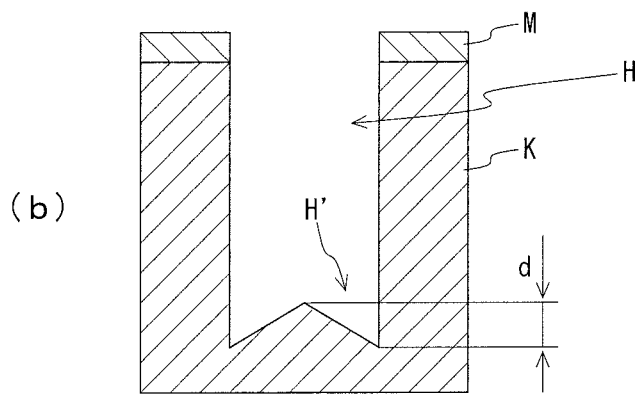
Figure 5:
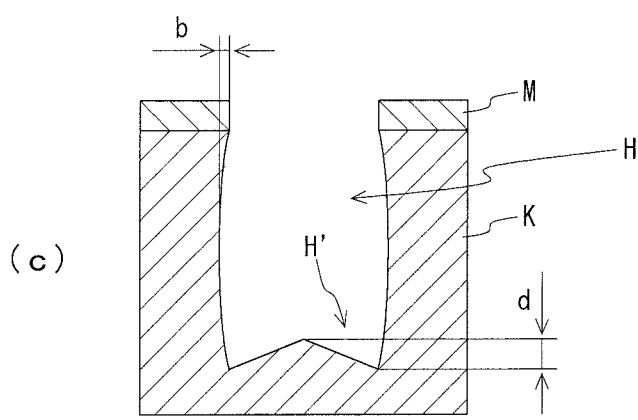

It is noted that the supply flow rate $V_4$ of $O_2$ gas is equal to or less than 1.25 times the supply flow rate $V_1$ of $SF_6$ gas, and it is preferable that it is equal to or less than one time the supply flow rate $V_1$ of $SF_6$ gas, and it is more preferable that it is equal to or less that 0.25 times the supply flow rate $V_1$ of $SF_6$ gas. The reason for this is that, when the supply flow rate $V_4$ of $O_2$ gas is small, as shown in FIGS. 4 and 5, etching can be performed isotropically with little formation of a passivation film. That is, in the step E1, it is preferable to set the supply flow rate of $O_2$ gas at a small one for allowing isotropic etching to proceed, and $O_2$ gas may be not supplied at all.

In the first etching step E1, ions generated by the generation of plasma from the $SF_6$ gas and the $O_2$ gas are made incident onto the silicon carbide substrate K by the bias potential and collide therewith and thereby the silicon carbide substrate K is etched, and radicals and ions generated by the generation of plasma from the $SF_6$ gas react with silicon atoms constituting the silicon carbide substrate K and thereby the silicon carbide substrate K is etched. Further, silicon atoms generated by the etching of the silicon carbide substrate K and silicon atoms constituting a silicon compound react with radicals and ions generated by the generation of plasma from the $O_2$ gas and thereby silicon oxide is generated, and a passivation film is formed on surfaces of a hole and a trench by the silicon oxide. Although the passivation film is formed by the supply of $O_2$ gas, since the supply flow rate of $O_2$ gas is small, the passivation film is not sufficiently formed and therefore the silicon carbide substrate K is isotropically etched. It is noted that some of the radicals and ions generated by the generation of plasma from the $O_2$ gas react with carbon atoms generated by the etching of the silicon carbide substrate K and thereby the carbon atoms are converted into an oxide, and the oxide is removed.

On the other hand, in the second etching step E2, the silicon carbide substrate K is heated to a temperature equal to or higher than 200° C., $SF_6$ gas, Ar gas and $O_2$ gas are supplied into the processing chamber 11 from the gas supply sections 26, 27, 28, respectively, the pressure inside the processing chamber 11 is reduced to a predetermined pressure by the exhaust device 20, and RF power is supplied to the coils 31 and the platen 15 by the RF power supply units 32, 35, respectively.

It is noted that the supply flow rate $V_3$ of $O_2$ gas is equal to or more than 0.75 times the supply flow rate $V_1$ of $SF_6$ gas, and it is preferable that it is equal to or more than one time the supply flow rate $V_1$ of $SF_6$ gas, and it is more preferable that it is equal to or more than 1.5 times the supply flow rate $V_1$ of $SF_6$ gas. The reason for this is that, when the supply flow rate $V_3$ of $O_2$ gas is large, as shown in FIGS. 4 and 5, although an additional sub-trench H' is easily formed near the side wall in the bottom of a hole H or trench H, the side wall can be prevented by a passivation film from being etched.

In the second etching step E2, ions generated by the generation of plasma from the $SF_6$ gas and the $O_2$ gas are made incident onto the silicon carbide substrate K by the bias potential and collide therewith and thereby the silicon carbide substrate K is etched, and radicals and ions generated by the generation of plasma from the $SF_6$ gas react with silicon atoms constituting the silicon carbide substrate K and thereby the silicon carbide substrate K is etched. Further, silicon atoms generated by the etching of the silicon carbide substrate K and silicon atoms constituting a silicon compound react with radicals and ions generated by the generation of plasma from the $O_2$ gas and thereby silicon oxide is generated, and a passivation film is formed on the surfaces of the hole and the trench by the silicon oxide. Although the passivation film on the bottoms of the hole and the trench, on which a large amount of ions are incident, is removed and the bottoms of the hole and the trench are etched, the side walls of the hole and the trench, on which a small amount of ions are incident, are prevented by the passivation film from being etched. In this way, the silicon carbide substrate K is etched while the side walls of the hole and the trench are protected by the passivation film. It is noted that some of the radicals and ions generated by the generation of plasma from the $O_2$ gas react with carbon atoms generated by the etching of the silicon carbide substrate K and thereby the carbon atoms are converted into an oxide, and the oxide is removed.

When these first etching step E1 and second etching step E2 are alternately repeated, the central portions of the bottoms of the hole and the trench in which a sub-trench is formed are etched and thereby the bottoms of the hole and the trench are made flat or into a round shape (a shape in which the bottom has a deeper depth at the central portion than near the side wall) in the first etching step E1, and etching of the side walls is prevented in the second etching step E2, thereby allowing etching to proceed in the direction of the depth of the hole and the trench while preventing formation of a bowing shape and a sub-trench.

Figure 3:
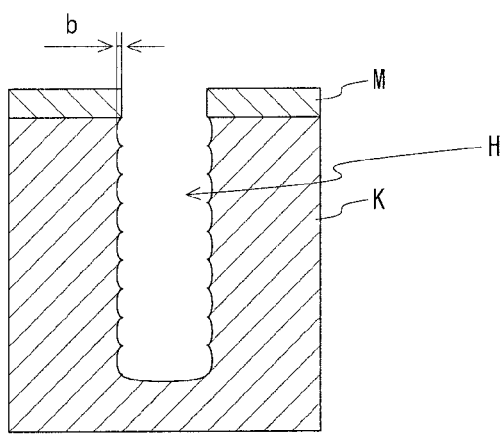
FIG. 3 is a sectional view showing an etching shape obtained by etching in the embodiment.

A thus formed etching shape is shown in FIG. 3. As shown in FIG. 3, there is resulted a shape having a side wall surface where an arc shape which is formed by the side wall being slightly etched is formed repeatedly in the depth direction. Thus, although the side wall is slightly etched, the side-wall etching amount is very small as compared with a one-step etching, and no sub-trench is formed. It is noted that the reference M in FIG. 3 indicates the mask.

Once a hole and a trench having a predetermined depth is formed by etching the silicon carbide substrate K as described above, the above-described series of steps is terminated and the silicon carbide substrate K is loaded out the processing chamber 11.

It is noted that, although the silicon carbide substrate K is heated to a temperature equal to or higher than 200° C. in the etching steps E1, E2, the silicon dioxide film as etching mask is not softened and the shape accuracy of the mask pattern is not reduced because the silicon dioxide film has a higher heat resistance as compared with a resist. Further, because a silicon oxide film is formed as the passivation film, it is not possible that no passivation film is formed because of thermal decomposition like a polymer film which is often used for anisotropic etching of a silicon substrate (because a polymer film is bonded by the Van der Waals force, the bond thereof is very weak and is broken at approximately 100° C.). The upper limit of the temperature to which the silicon carbide substrate K is heated is, for example, 500° C. because of structural problems of the etching apparatus 1.

Further, as described above, since the silicon carbide substrate K is heated to a temperature equal to or higher than 200° C., even for the silicon carbide substrate K having a strong interatomic bond, atoms constituting the silicon carbide substrate K easily react with radicals and ions generated by the generation of plasma from the $SF_6$ gas, and therefore etching proceeds efficiently.

Thus, according to the etching method of the embodiment, the first etching step E1 in which the silicon carbide substrate K is isotropically etched and the second etching step E2 in which the silicon carbide substrate K is etched while forming a passivation film to protect the side walls of a hole and a trench are alternately repeated and thereby etching can be performed in the direction of the depth of the hole and the trench while suppressing etching of the side walls and while preventing formation of an additional trench near the side walls of the hole and the trench, and therefore it is possible to etch a silicon carbide substrate K with a higher accuracy.

Further, since, in the etching steps E1, E2, some of the radicals and ions generated by the generation of plasma from the $O_2$ gas react with carbon atoms generated by the etching of the silicon carbide substrate K and thereby the carbon atoms are converted into an oxide and the oxide is removed, it is possible to prevent occurrence of a residue caused by deposition of a compound including carbon in the hole and the trench.

In this connection, when the etching method of the embodiment was applied to etch a silicon carbide substrate K, the silicon carbide substrate K had an etching shape as shown in FIG. 3, and formation of a bowing shape and a sub-trench was suppressed and a very highly accurate etching shape was obtained. Specifically, in the conventional etching method, it was not possible to keep the side-wall etching amount b at or below 50 nm in a state where no sub-trench was formed. However, in the embodiment, although the etching shape was scallop-shaped, it was possible to keep the side-wall etching amount b (see FIG. 3) at or below 30 nm. It is noted that the processing conditions of the second etching step E2 were as follows: the processing time was 10 seconds; the supply flow rate $V_1$ of $SF_6$ gas, the supply flow rate $V_2$ of Ar gas and the supply flow rate $V_3$ of $O_2$ gas were 10, 60 and 500 sccm, respectively (see FIG. 2); the pressure within the processing chamber 11 was 3 Pa; the RF power supplied to the coils 31 was 2500 W; the RF power supplied to the platen 15 was 700 W; and the temperature to which the silicon carbide substrate K was heated was equal to or higher than 200° C., and the processing conditions of the first etching step E1 were as follows: the processing time was 2 seconds; the supply flow rate $V_1$ of $SF_6$ gas, the supply flow rate $V_2$ of Ar gas and the supply flow rate $V_4$ of $O_2$ gas were 10, 60 and 0 sccm, respectively (see FIG. 2); the pressure inside the processing chamber 11 was 3 Pa; the RF power supplied to the coils 31 was 2500 W; the RF power supplied to the platen 15 was 700 W; and the temperature to which the silicon carbide substrate K was heated was equal to or higher than 200° C. The processing time of the second etching step E2 (10 seconds) and the processing time of the first etching step E1 (2 seconds) are each merely an example, and the side-wall etching amount b can be made even smaller than the above-described value equal to or less than 30 nm by making the processing time of the second etching step E2 and the processing time of the first etching step E1 shorter than 10 seconds and 2 seconds, respectively, for example.

Thus, one embodiment of the present invention has been described. However, a specific embodiment in which the present invention can be implemented is not limited thereto.

Because it is preferable that the temperature of the heated silicon carbide substrate K is constant when performing the etching steps E1, E2, the silicon carbide substrate K may be previously heated to a predetermined temperature before repeating the etching steps E1, E2. The heating method in this case is not particularly limited, but it is advantageous that an inert gas is supplied into the processing chamber 11 and plasma is generated from the inert gas, a bias potential is applied to the platen 15, and ions generated by the generation of plasma from the inert gas are made incident onto the silicon carbide substrate K, thereby heating the silicon carbide substrate K, for example. Further, as for the heating when performing each of the etching steps E1, E2, it is advantageous that ions generated by the generation of plasma from $SF_6$ gas, Ar gas and $O_2$ gas are made incident onto the silicon carbide substrate K, thereby heating the silicon carbide substrate K.

Further, the supply flow rate of $SF_6$ gas in the first etching step E1 and the supply flow rate of $SF_6$ gas in the second etching step E2 may be different from each other. Furthermore, although, in the above embodiment, $SF_6$ gas, Ar gas and $O_2$ gas are supplied into the processing chamber 11 in the second etching step E2, a configuration is possible in which $SF_6$ gas is not supplied and at least $O_2$ gas is supplied and RF power equal to or more than 300 W is supplied to the platen 15 by the RF power supply unit 35.

Also when thus configured, ions generated by the generation of plasma from the $O_2$ gas are made incident onto the silicon carbide substrate K by the bias potential and collide therewith and thereby the silicon carbide substrate K is etched, and silicon atoms generated by the etching of the silicon carbide substrate K react with radicals and ions generated by the generation of plasma from the $O_2$ gas and thereby silicon oxide is generated, and a passivation film is formed on surfaces of a hole and a trench by the silicon oxide. Therefore, it is possible to etch the silicon carbide substrate K while protecting the side walls of a hole and a trench with a passivation film. However, unless RF power equal to or more than 300 W is supplied to the platen 15, it is not possible to generate silicon atoms enough for the formation of a passivation film having a level higher than a certain level because the amount of ions incident onto the silicon carbide substrate K is small.

Further, instead of the etching steps E1, E2, an etching step (first step) and a passivation-film formation step (second step) may be alternately repeated. In this case, in the etching step, the silicon carbide substrate K is heated to a temperature equal to or higher than 200° C., $SF_6$ gas, Ar gas and $O_2$ gas are supplied into the processing chamber 11 from the gas supply sections 26, 27, 28, respectively, the pressure inside the processing chamber 11 is reduced to a predetermined pressure by the exhaust device 20, and RF power is supplied to the coils 31 and the platen 15 by the RF power supply units 32 35, respectively. In this etching step, ions generated by the generation of plasma from the $SF_6$ gas and the $O_2$ gas are made incident onto the silicon carbide substrate K by the bias potential and collide therewith and thereby the silicon carbide substrate K is etched, and radicals and ions generated by the generation of plasma from the $SF_6$ gas react with silicon atoms constituting the silicon carbide substrate K and thereby the silicon carbide substrate K is etched. Further, silicon atoms generated by the etching of the silicon carbide substrate K and silicon atoms constituting a silicon compound react with radicals and ions generated by the generation of plasma from the $O_2$ gas and thereby silicon oxide is generated, and a passivation film is formed on surfaces of a hole and a trench by the silicon oxide.

On the other hand, in the passivation-film formation step, for example, $SiF_4$ gas and $SiCl_4$ gas as a silicon-containing gas are supplied into the processing chamber 11 from a not-shown gas supply section and $O_2$ gas is supplied into the processing chamber 11 from the gas supply section 28, the pressure inside the processing chamber 11 is reduced to a predetermined pressure by the exhaust device 20, and RF power is supplied to the cols 31 and the platen 15 by the RF power supply units 32, 35, respectively. In this passivation-film formation step, radicals and ions generated by the generation of plasma from the $SiF_4$ gas and the $SiCl_4$ gas react with radicals and ions generated by the generation of plasma from the $O_2$ gas and thereby silicon oxide is generated, and a passivation film is formed on the surfaces of the hole and the trench by the silicon oxide.

When these etching step (first step) and passivation-film formation step (second step) are repeated, because the passivation film is removed and etching is performed in the etching step and the passivation film is formed on the side walls and the bottoms of the hole and the trench in the passivation-film formation step, etching proceeds in the direction of the depth of the hole and the trench while the side walls of the hole and the trench are prevented from being etched. Therefore, similarly to the above, it is possible to prevent formation of a bowing shape and a sub-trench.

Next, the inventors found out that a selectivity to $SiO_2$ mask could be greatly improved by supplying $SiCl_4$ gas as the silicon-containing gas from the outside, which is described below. It is noted that a selectivity to mask is a value obtained by dividing the etching rate of etching of a substrate by the etching rate of etching of a mask, and the selectivity to $SiO_2$ mask mentioned below is a value obtained by diving the etching rate of etching of the SiC substrate by the etching rate of etching of the $SiO_2$ mask.

As described above, in the second step, a configuration is possible in which a processing gas including a silicon-containing gas and oxygen gas or nitrogen gas is supplied into the processing chamber and plasma is generated from the processing gas, and a silicon oxide film or a silicon nitride film is formed as passivation film on the silicon carbide substrate. The embodiment described below has a configuration in which a silicon oxide film is formed as passivation film on the silicon carbide substrate by supplying $SiCl_4$ gas as the silicon-containing gas.

Although an $SiO_2$ passivation film can be obtained also by causing Si naturally generated at a time of SiC etching to react with $O_2$ ($Si+O_2 \rightarrow SiO_2$), in this method, Si generated by etching is limited and it is therefore difficult to form a thick passivation film. Therefore, in this embodiment, $SiO_2$ as passivation film is directly and abundantly formed by supplying $SiCl_4$ gas from the outside ($SiCl_4+O_2 \rightarrow SiO_2+2Cl_2$), thereby improving the selectivity to $SiO_2$ mask.

As described above, in anisotropic etching of a silicon substrate in which etching can be performed at a relatively low temperature, polymer can be used for a passivation film for protecting the side walls of a hole and a trench. Specifically, the side walls can be protected by a polymer passivation film by introducing a CF type gas (for example, $C_4F_8$) together with a gas for etching.

However, in order to etch SiC at a high rate without occurrence of a sub-trench, it is necessary to etch the SiC at a high temperature equal to or higher than 200° C. In that respect, a polymer film is bonded by the Van der Waalse force and therefore has a very weak bond, and therefore, for example, a CF type polymer is decomposed and cannot be deposited at such a high temperature.

In this embodiment, since the passivation film for protecting the side walls is formed by $SiO_2$, it is possible to etch SiC at a high rate in such a manner that a sub-trench does not occur, and further, as described above, since $SiO_2$ as the passivation film can be directly and abundantly formed by supplying $SiCl_4$ gas from the outside, there is an advantage that the amount of the formed passivation film for protecting the side walls can be adjusted independently from the amount of the gas for etching.

For a purpose of comparison, a case where the passivation film for protecting the side walls was formed by causing Si naturally generated at a time of SiC etching to react with $O_2$ ($Si+O_2 \rightarrow SiO_2$) is described/

The processing conditions for forming the passivation film were as follows: the time for passivation film formation was 10 seconds; the supply flow rate of $SF_6$ gas was 10 sccm; the supply flow rate of Ar gas was 60 sccm; the supply flow rate of $O_2$ gas was 600 sccm; the RF power supplied to the coils 31 was 2500 W; the power supplied to the platen 15 was 700 W; and the pressure inside the processing chamber 11 was 3 Pa, and the processing conditions for the subsequent etching were as follows: the etching time was 2 seconds; the supply flow rate of $SF_6$ gas was 10 sccm; the supply flow rate of Ar gas was 60 accm; the RF power supplied to the coils 31 was 2500 W; the power supplied to the platen 15 was 700 W; and the pressure inside the processing chamber 11 was 3 Pa.

As a result thereof, the resulting etching depth of the SiC was 1.05 µm. On the other hand, the initial film thickness of the $SiO_2$ mask was 2.0 µm and the remaining film thickness after etching was 0.94 µm. That is, the etching amount of the $SiO_2$ mask was 2.0 µm–0.94 µm=1.06 µm, and it was understood out that the SiC and the $SiO_2$ mask were etched by almost the same amount. That is to say, the selectivity to $SiO_2$ mask (1.05/1.06) was almost 1.

Figure 6:
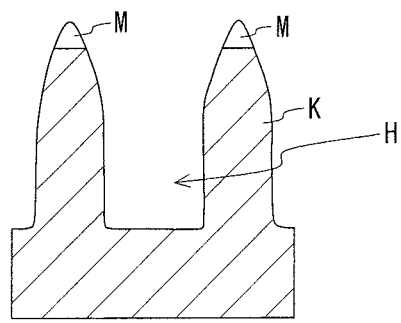
FIG. 6 is a schematic diagram of an etching structure when causing Si generated at a time of SiC etching to react with $O_2$.

Thus, it is understood that, when the passivation film for protecting the side walls is formed by causing Si naturally generated at a time of SiC etching to react with $O_2$, the value of the selectivity to $SiO_2$ mask is too bad (the selectivity to $SiO_2$ mask is almost 1), and therefore, as shown in FIG. 6, the $SiO_2$ mask M is etched beyond recognition when etching the SiC substrate K to form the hole H.

Next, as a preliminary experiment, the inventors investigated how a passivation film S ($SiO_2$) was deposited onto a trench-shaped SiC substrate K having a hole H by supplying $SiCl_4$ gas to the SiC substrate K from the outside ($SiCl_4+O_2 \rightarrow SiO_2+2Cl_2$).

The processing conditions for forming the passivation film were as follows: the time for passivation film formation was 30 seconds; the supply flow rate of $SiCl_4$ gas was 5 sccm; the supply flow rate of $O_2$ gas was 200 sccm; the RF power supplied to the coils 31 was 1500 W; the power supplied to the platen 15 was 0 W; and the pressure inside the processing chamber 11 was 3 Pa.

Figure 7:
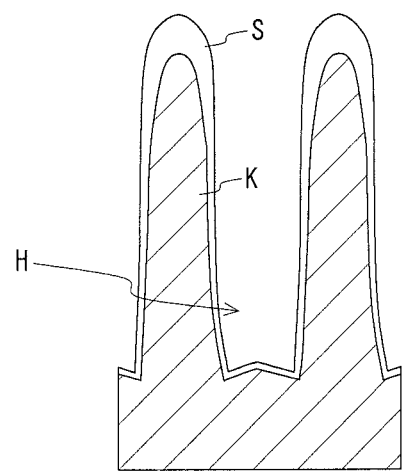
FIG. 7 is a schematic diagram of an etching structure when supplying $SiCl_4$ gas from the outside at a time of SiC etching and causing Si to react with $O_2$.

As a result thereof, the film thickness of the $SiO_2$ film deposited on the surface of the trench top portion was 0.19 µm, the film thickness of the $SiO_2$ film deposited on the surface of the trench side wall portion was less than the measurement limit, and the film thickness of the $SiO_2$ film deposited on the surface of the trench bottom portion was 0.03 μm. A schematic diagram of this state is shown in FIG. 7 and it is understood that the film thickness of the deposited SiO₂ film on the surface of the trench bottom portion is very small as compared with that on the surface of the trench top portion.

In order to investigate what etching structure was obtained when etching was performed in the above-described state where the SiO₂ film was deposited with a non-uniform thickness, the passivation-film forming process and the etching process were performed successively under the following processing conditions.

The processing conditions for forming the passivation film were as follows: the time for passivation film formation was 5 seconds; the supply flow rate of SiCl₄ gas was 5 sccm; the supply flow rate of O₂ gas was 200 sccm; the RF power supplied to the coils 31 was 1500 W; the power supplied to the platen 15 was 0 W; and the pressure inside the processing chamber 11 was 3 Pa, and the processing conditions for the subsequent etching were as follows: the etching time was 10 seconds; the supply flow rate of SF₆ gas was 10 sccm; the supply flow rate of Ar gas was 60 sccm; the RF power supplied to the coils 31 was 2500 W; the power supplied to the platen 15 was 700 W; and the pressure inside the processing chamber 11 was 4 Pa.

Figure 8:
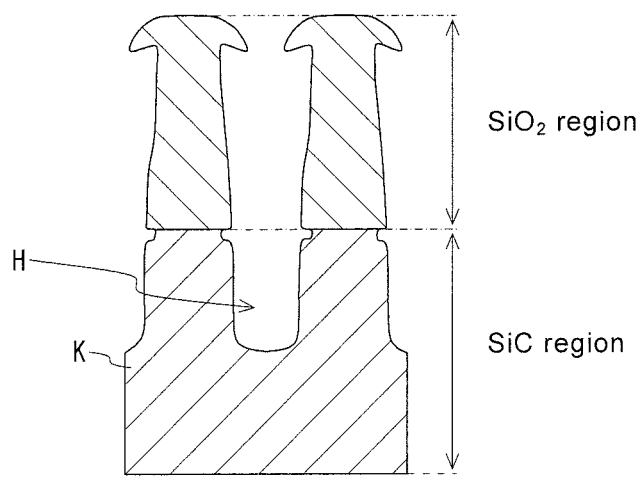
FIG. 8 is schematic diagram of an etching structure when performing etching in a state where a thick $SiO_2$ film is formed on the surface of a trench top portion.

The results thereof are schematically shown in FIG. 8. In FIG. 8, the SiC region under the one-dot chain line indicates a region in which the SiC substrate K is exposed, and the SiO₂ region above the one-dot chain line indicates a region which is covered by the SiO₂ mask provided on the surface of the SiC substrate K and the SiO₂ film deposited afterwards. It is understood that, as shown in FIG. 8, the umbrella-shaped portion where a thick SiO₂ film is formed on the surface of the trench top portion was hardly etched and remained, while the side wall on which the SiO₂ film as the passivation film was hardly deposited was etched into a distorted shape as if it was washed.

At this time, the etching depth of the SiC was 2.04 μm. On the other hand, the initial film thickness of the SiO₂ mask was 1.95 μm, the remaining film thickness after etching was 2.04 μm (the film thickness after etching was larger than the initial film thickness), and the selectivity between the SiC and the SiO₂ mask was infinite.

However, as for an etching structure as shown in FIG. 8, since the etching shape of the side wall is distorted and the shape accuracy is bad, when imbedding an insulation film or an electrode therein, a cavity occurs and the film thickness of the side wall easily becomes non-uniform, which causes product defects, such as causing electric leakage. Therefore, even though the selectivity to mask is high, it cannot be said that an etching structure as shown in FIG. 8 is a practical etching structure.

Therefore, as a result of hard study, the inventors achieved improvement of the selectivity to mask and improvement of shape of etching structure by simultaneously supplying SF₆ gas and SiCl₄ gas and simultaneously performing SiO₂ deposition caused by reaction between Si naturally generated at a time of SiC etching and O₂ and SiO₂ deposition caused by the supply of SiCl₄ gas.

Specifically, the processing conditions for forming the passivation film were as follows: the time for passivation film formation was 3 seconds; the supply flow rate of SF₆ gas was 5 sccm; the supply flow rate of SiCl₄ gas was 5 sccm; the supply flow rate of O₂ gas was 600 sccm; the RF power supplied to the coils 31 was 1000 W; the power supplied to the platen 15 was 700 W; and the pressure inside the processing chamber 11 was 1.5 Pa, and the processing conditions for the subsequent etching were as follows: the etching time was 6 seconds; the supply flow rate of SF₆ gas was 10 sccm; the supply flow rate of Ar gas was 60 sccm; the RF power supplied to the coils 31 was 2500 W; the power supplied to the platen 15 was 700 W; and the pressure inside the processing chamber 11 was 4 Pa.

Figure 9:
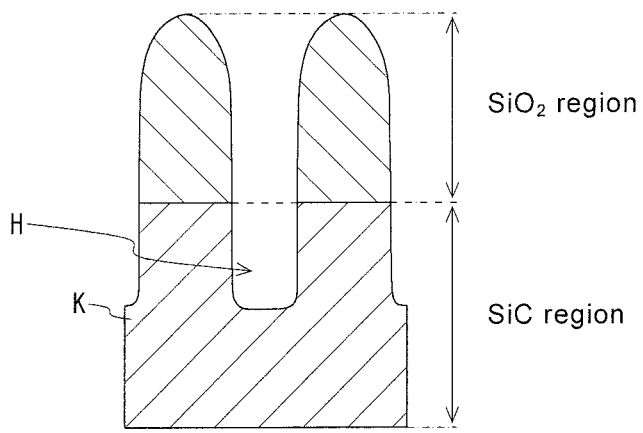
FIG. 9 is a schematic diagram of an etching structure when generating $SiO_2$ by Si generated at a time of Si etching and $SiCl_4$ gas supplied from the outside.

The results thereof are schematically shown in FIG. 9. In FIG. 9, the SiC region under the one-dot chain line indicates a region in which the SiC substrate K is exposed, and the SiO₂ region above the one-dot chain line indicates a region in which the surface of the SiC substrate K is covered by the SiO₂ film. It is understood that, as shown in FIG. 9, an etching structure having a good etching shape without a bowing shape and a sub-trench was obtained. At this time, the etching depth of the SiC was 1.03 μm, while the initial film thickness of the mask was 1.95 μm and the remaining film thickness after etching was 1.89 μm. That is, the etching amount of the mask was 1.95 μm−1.89 μm=0.06 μm, and the selectivity to SiO₂ mask (1.03/0.06) was about 17.2.

Thus, it is possible to simultaneously achieve improvement of the selectivity to mask and improvement of shape of etching structure by simultaneously supplying SF₆ gas and SiCl₄ gas and simultaneously performing SiO₂ deposition caused by reaction between Si naturally generated at a time of SiC etching and O₂ and SiO₂ deposition caused by the supply of SiCl₄ gas. FIG. 10 is a table showing the processing conditions of the examples shown in FIGS. 6 to 9.

Further, although, in the above embodiments, O₂ gas is supplied into the processing chamber 11 and a silicon oxide film is formed as passivation film, N₂ gas instead of O₂ gas may be supplied into the processing chamber 11 and a silicon nitride (for example, SiNx) film may be formed as passivation film.

Furthermore, although a silicon carbide substrate having the crystal structure of 4H—SiC is exampled as a substrate K to be etched, the substrate K to be etched may be a silicon carbide substrate having a crystal structure other than 4H—SiC. Further, although, in the above embodiments, the etching method of the present invention is performed using the etching apparatus 1, an etching apparatus having another configuration may be used for performing this etching method.

Additionally, by using a chlorine-containing gas, such as Cl₂ gas, BCl₃ gas, CCl₄ gas and SiCl₄ gas, instead of the fluorine-containing gas (SF₆ gas) used in the above embodiments, the same effect as described above can be achieved. Therefore, such a chlorine-containing gas may be used to etch a silicon carbide substrate K in the same way as described above.

What is claimed is:

1. An etching method of etching a silicon carbide substrate placed on a platen in a processing chamber, comprising:
    alternately repeating a first step in which the silicon carbide substrate is heated to a temperature equal to or higher than 200° C., a processing gas including a fluorine-containing gas is supplied into the processing chamber and plasma is generated from the processing gas, and RF power is supplied to the platen to thereby apply a bias potential to the platen, thereby etching the silicon carbide substrate, and a second step in which the silicon carbide substrate is heated to a temperature equal to or higher than 200° C., supplying a processing gas including oxygen gas or nitrogen gas into the processing chamber and generating plasma from the processing gas, and supplying RF power to the platen thereby to apply a bias potential to the platen, thereby forming a silicon oxide film or a silicon nitride film as passivation film on the silicon carbide substrate.

2. An etching method according to claim 1, in which:
in the first step, the silicon carbide substrate is isotropically etched, and
in the second step, a processing gas including a fluorine-containing gas in addition to the oxygen gas or nitride gas is supplied into the processing chamber.

3. An etching method according to claim 2, in which:
in the first step, a processing gas including oxygen gas in addition to the fluorine-containing gas is supplied into the processing chamber and plasma is generated from the processing gas.

4. An etching method according to claim 2, in which:
in the first step, a processing gas including oxygen gas in addition to the fluorine-containing gas is supplied into the processing chamber and plasma is generated from the processing gas, and a supply flow rate of the oxygen gas is equal to or less than 1.25 times a supply flow rate of the fluorine-containing gas, and
in the second step, a processing gas including a fluorine-containing gas in addition to the oxygen gas is supplied into the processing chamber and plasma is generated from the processing gas, and a supply flow rate of the oxygen gas is equal to or more than 0.75 times a supply flow rate of the fluorine-containing gas.

5. An etching method according to claim 2, in which:
in the first step, a processing gas including oxygen gas in addition to the fluorine-containing gas is supplied into the processing chamber and plasma is generated from the processing gas, and a supply flow rate of the oxygen gas is equal to or less than 1 time a supply flow rate of the fluorine-containing gas; and
in the second step, a processing gas including a fluorine-containing gas in addition to the oxygen gas is supplied into the processing chamber and plasma is generated from the processing gas, and a supply flow rate of the oxygen gas is equal to or more than 1 time a supply flow rate of the fluorine-containing gas.

6. An etching method according to claim 2, in which:
in the first step, a processing gas including oxygen gas in addition to the fluorine-containing gas is supplied into the processing chamber and plasma is generated from the processing gas, and a supply flow rate of the oxygen gas is equal to or less than 0.25 times a supply flow rate of the fluorine-containing gas; and
in the second step, a processing gas including a fluorine-containing gas in addition to the oxygen gas is supplied into the processing chamber and plasma is generated from the processing gas, and a supply flow rate of the oxygen gas is equal to or more than 1.5 times a supply flow rate of the fluorine-containing gas.

7. An etching method according to claim 1, in which:
in the second step, RF power equal to or more than 300 W is supplied to the platen to thereby apply a bias potential to the platen.

8. An etching method according to claim 1, in which:
in the second step, a processing gas including a silicon-containing gas in addition to the oxygen gas or nitrogen gas is supplied into the processing chamber and plasma is generated from the processing gas, and a silicon oxide film or a silicon nitride film is formed as passivation film on the silicon carbide substrate.

9. An etching method according to claim 8, in which:
in the first step, a processing gas including oxygen gas in addition to the fluorine-containing gas is supplied into the processing chamber and plasma is generated from the processing gas.

10. An etching method according to claim 8, in which the silicon-containing gas is $SiCl_4$ gas.

11. An etching method according to claim 1, in which:
in the second step, a processing gas including a fluorine-containing gas and a silicon-containing gas in addition to the oxygen gas is supplied into the processing chamber and plasma is generated from the processing gas to form a silicon oxide film as passivation film on the silicon carbide substrate.

12. An etching method of etching a silicon carbide substrate placed on a platen in a processing chamber, comprising:
heating the silicon carbide substrate to a temperature equal to or higher than 200° C;
supplying a processing gas including a silicon-containing gas as well as oxygen gas or nitrogen gas into the processing chamber and generating plasma from the processing gas, the silicon-containing gas including at least $SiF_4$ gas or $SiCl_4$ gas; and
etching the silicon carbide substrate while forming a silicon oxide film or a nitrogen oxide film as passivation film on the silicon carbide substrate.

13. An etching method according to claim 12, in which the processing gas further includes a fluorine-containing gas.

14. An etching method according to claim 13, in which RF power is supplied to the platen to thereby apply a bias potential to the platen.

15. An etching method according to claim 14, in which RF power equal to or more than 300 W is supplied to the platen.

16. An etching method according to claim 12, in which RF power is supplied to the platen to thereby apply a bias potential to the platen.

17. An etching method according to claim 16, in which RF power equal to or more than 300 W is supplied to the platen.

* * * * *